(12) United States Patent
Xu et al.

(10) Patent No.: US 12,047,089 B2
(45) Date of Patent: Jul. 23, 2024

(54) MULTI-PHASE ANALOG TO DIGITAL CONVERTER (ADC)

(71) Applicant: NXP USA, Inc., Austin, TX (US)

(72) Inventors: Weiwei Xu, Cupertino, CA (US); Xiaoyue Wang, San Jose, CA (US)

(73) Assignee: NXP USA, Inc., Austin, TX (US)

(*) Notice: Subject to any disclaimer, the term of this patent is extended or adjusted under 35 U.S.C. 154(b) by 152 days.

(21) Appl. No.: 17/658,517

(22) Filed: Apr. 8, 2022

(65) Prior Publication Data
US 2023/0327680 A1 Oct. 12, 2023

(51) Int. Cl.
H03M 1/12 (2006.01)
H03M 1/46 (2006.01)

(52) U.S. Cl.
CPC ......... H03M 1/466 (2013.01); H03M 1/1245 (2013.01)

(58) Field of Classification Search
CPC .......................... H03M 1/1245; H03M 1/146
USPC ................. 341/144, 155, 122, 163, 118, 120
See application file for complete search history.

(56) References Cited

U.S. PATENT DOCUMENTS

| 4,028,534 A * | 6/1977 | Tucker | ................. G01N 21/274 330/145 |
| 10,715,165 B2 | 7/2020 | Kurahashi et al. | |
| 10,903,843 B1 | 1/2021 | Monangi et al. | |
| 10,938,401 B1 * | 3/2021 | Olieman | ................ H03M 1/462 |
| 2013/0187803 A1 * | 7/2013 | Kaald | ...................... H03M 3/37 341/143 |

OTHER PUBLICATIONS

Chun-Cheng Liu, A 10bit 320MS/s Low Cost SAR ADC for 802.11ac Application in 20nm CMOS, JSSC, vol. 50, No. 11, Nov. 2015.
WikipediA; "Successive-approximation ADC"; retrieved from the Internet https://en.wikipedia.org/wiki/Successive-approximation_ADC; 4 pages (Apr. 4, 2022).

* cited by examiner

Primary Examiner — Peguy Jean Pierre (57) ABSTRACT

One example discloses an analog to digital converter (ADC), including: an analog comparator configured to receive an analog input signal and in response generate a comparator output signal; a set of digital to analog converter (DAC) elements configured to receive the analog input signal; wherein the DAC elements are configured to generate an analog DAC output signal in response to a digital code and the analog input signal; wherein the comparator is configured to receive the analog DAC output signal; a feedback circuit configured to generate a first feedback signal and a second feedback signal from the comparator output signal; a controller configured to enable a first set of controller elements in response to the first feedback signal; wherein the controller configured to enable a second set of controller elements in response to the second feedback signal; and wherein the controller elements are configured to generate the digital code.

19 Claims, 9 Drawing Sheets

MULTI-PHASE ANALOG TO DIGITAL CONVERTER (ADC)

The present specification relates to systems, methods, apparatuses, devices, articles of manufacture and instructions for analog to digital conversion.

SUMMARY

According to an example embodiment, an analog to digital converter (ADC), comprising: an analog comparator configured to receive an analog input signal and in response generate a comparator output signal; a set of digital to analog converter (DAC) elements configured to receive the analog input signal; wherein the DAC elements are configured to generate an analog DAC output signal in response to a digital code and the analog input signal; wherein the comparator is configured to receive the analog DAC output signal; a feedback circuit configured to generate a first feedback signal and a second feedback signal from the comparator output signal; a controller configured to enable a first set of controller elements in response to the first feedback signal; wherein the controller is configured to enable a second set of controller elements in response to the second feedback signal; and wherein the controller elements are configured to generate the digital code.

In another example embodiment, the first feedback signal is generated at a different time than the second feedback signal.

In another example embodiment, the first set of controller elements are not enabled at a same time as the second set of controller elements.

In another example embodiment, the first and second controller elements are configured to operate in a hold phase and a sampling phase.

In another example embodiment, when the first set of controller elements are in the hold phase, then the second set of controller elements are in the sampling phase.

In another example embodiment, the hold phase holds a current digital output of at least one of the controller elements.

In another example embodiment, the sampling phase enables a current digital output of at least one of the controller elements to change in response to the analog input signal.

In another example embodiment, the feedback circuit includes a divider and a phase select switch configured to generate the first and second feedback signals from the comparator output signal.

In another example embodiment, the phase select switch is configured to receive the comparator output signal from a delay circuit.

In another example embodiment, the delay circuit is configured to delay a falling edge of the comparator output signal.

In another example embodiment, the feedback circuit further includes an inverter configured to enable the comparator in response to the comparator output signal.

In another example embodiment, the first and second controller elements are latches.

In another example embodiment, a subset of the latches are configured to be activated by receiving a signal from another latch.

In another example embodiment, the latches are successively activated in series.

In another example embodiment, the analog input signal is an analog input voltage.

In another example embodiment, at least one of the DAC elements includes a capacitor and a switch.

In another example embodiment, one end of the capacitor is coupled to the analog input signal; another end of the capacitor is coupled to the switch; the switch is further coupled to the comparator; and a position of the switch is controlled by at least one bit in the digital code.

In another example embodiment, the capacitor and the switch together form a capacitor DAC (CDAC) element.

In another example embodiment, the ADC is configured as a successive-approximation register (SAR) ADC.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Figure 1:
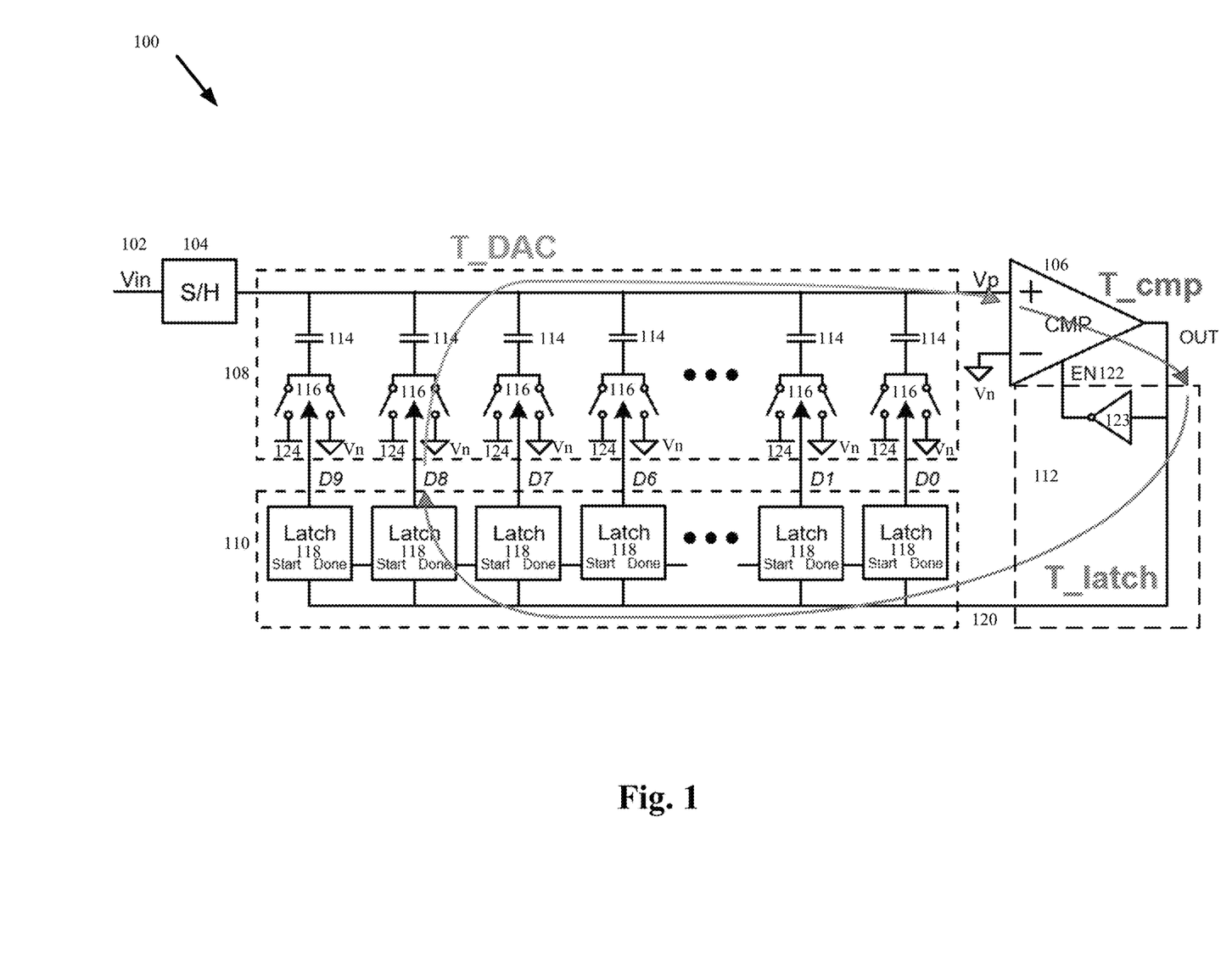
FIG. 1 represents an example analog to digital converter (ADC).

FIG. 1 represents an example analog to digital converter (ADC) 100. The ADC 100 has a successive-approximation register (SAR) topology (single-ended circuit shown, however a differential mode circuit can be derived from this), configured for asynchronous operation. The SAR ADC 100 converts an analog input voltage (Vin) 102 into digital output signal (D9-D0) using a binary search through all possible quantization levels before finally converging upon the digital output signal (D9-D0) for each conversion.

The SAR ADC 100 includes: a sample-and-hold (S/H) circuit 104 configured to receive the input voltage (Vin) 102, and an analog voltage comparator 106 that compares Vin 102 to an accumulated set of capacitor voltages (Vn) output from an internal DAC 108 (e.g. CDAC) that have been selected by a controller 110. The comparator 106 output (CMP_OUT) is fed into a feedback circuit 112 that is also coupled to the controller 110.

The internal DAC 108 includes a set of capacitors 114 and a set of switches. The controller 110 includes a set of latches 118 that trigger each other (i.e. done> start) after each successive comparison. The feedback circuit 112 is configured to generate a feedback signal 120 (e.g. phase signal) sent back to the controller 110 and includes an inverter 123 for generating an enable signal 122 (CMP_EN) sent back to the comparator 106. A clock circuit (not shown) drives various circuits in the SAR ADC 100 as well.

In operation, the controller 110 is initialized so that the most significant bit (MSB-D9) is equal to a digital 1. This code is fed into the internal DAC 108, which then supplies the analog equivalent of this digital code into the comparator 106 circuit for comparison with the sampled input voltage 102. If this analog voltage exceeds Vin, then the comparator causes the controller 110 to reset this bit; otherwise, the bit is left as 1. Then the next bit is set to 1 and the same test is done successively, continuing this binary search until every bit of the digital output signal (D9-D0) has been tested. The resulting digital output signal (D9-D0) code is the digital approximation of the sampled input voltage (Vin) 102 and is finally output by the SAR ADC 100 to an output buffer (not shown) at the end of the analog to digital conversion.

This SAR ADC 100 includes of a capacitor DAC (CDAC) configuration. The CDAC is the set of individually switched binary-weighted capacitors 114. The amount of charge upon each capacitor in the set 114 is selectively sent to the Vn pin of the comparator 106. Since the set of capacitors 114 are coupled to receive the input signal Vin 102 voltage, and have a charge based on their respective capacitance and the input voltage 102.

During the conversion process, first the MSB capacitor is switched to a Vref voltage 124, which corresponds to the full-scale range of the ADC. Due to the binary-weighting of the array, the MSB (D9) capacitor forms a 1:1 charge divider with the rest of the array. Thus, the input voltage to the comparator is now—Vin+Vref/2. Subsequently, if Vin is greater than Vref/2, then the comparator outputs a digital 1 as the MSB, otherwise it outputs a digital 0 as the MSB. Each capacitor is tested in the same manner until the comparator input voltage converges to the offset voltage, or at least as close as possible given the resolution of the internal DAC 108.

A cycle time (T_cycle) for each bit (D9-D0) of the SAR ADC 100 conversion is T_cycle=T_cmp+T_latch+T_DAC as shown. T_cmp is a comparator decision time (e.g. comparator enable>>Vout), T_latch is a controller 110 latch delay, and T_DAC is the internal DAC 108 settling time. In some example embodiments, T_cmp=40 ps, T_latch=20 ps, and T_DAC=20 ps.

The SAR ADC 100 controller 110 can be programmed to operate either synchronously, where a time interval of each conversion cycle (T_cycle) is determined by external clock, or asynchronously where T_cycle is driven by internal signal flow. An asynchronous SAR ADC 100 reduces an overhead time for each conversion, hence can achieve higher speed than a synchronous SAR ADC 100.

Figure 2:
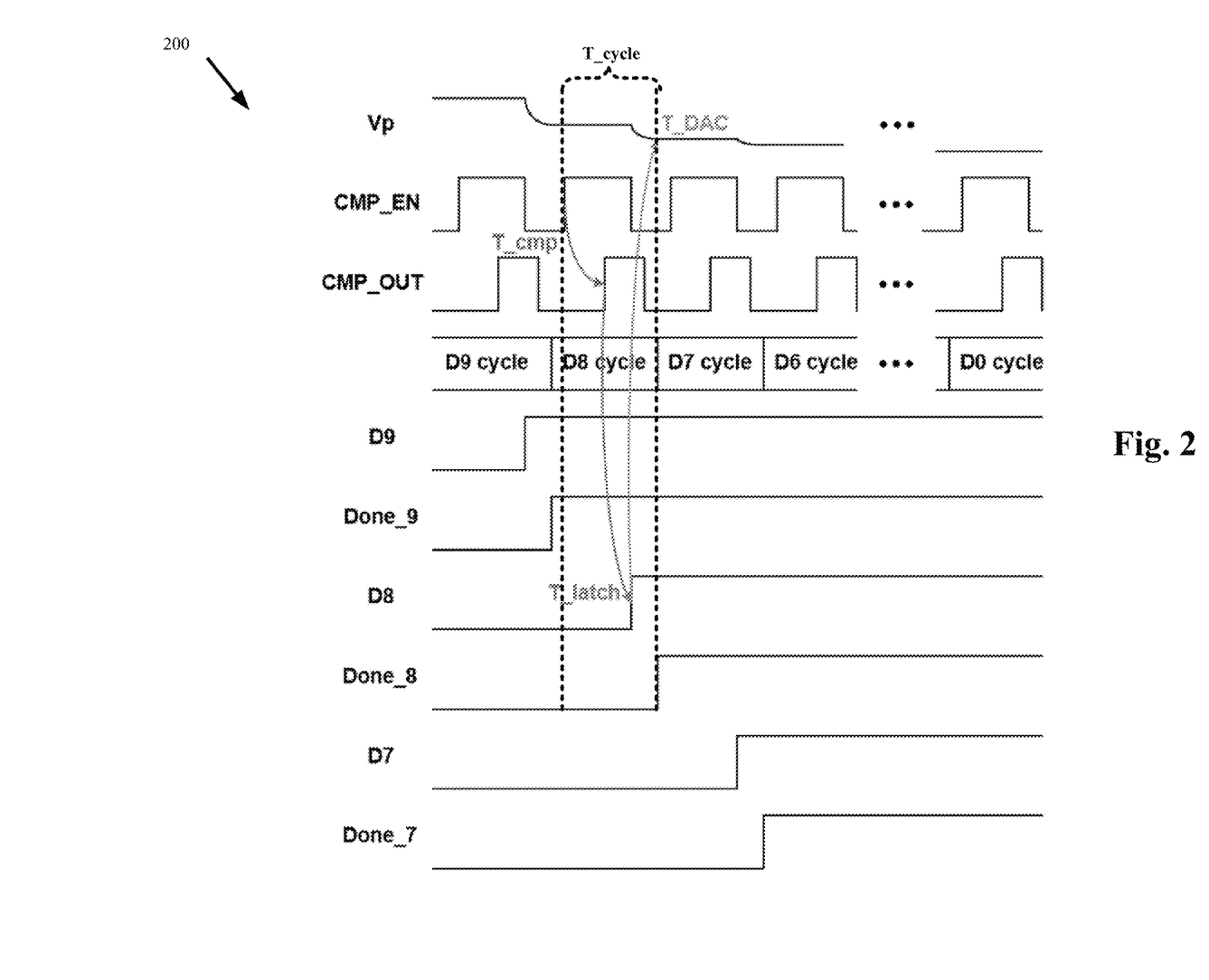
FIG. 2 represents an example set of idealized operational signals for the example ADC.

FIG. 2 represents an example 200 set of idealized operational signals for the example asynchronous SAR ADC 100.

For the SAR ADC 100, to achieve maximum speed, there are two constraints. First timing delay among the loop of CMP, latch (inside SAR logic) and DAC: T_cycle≥T_cmp+T_latch+T_DAC=T_cycle_min. Second, timing between CMP output (CMP_OUT) and the controller 110 latches 118.

Figure 3A:
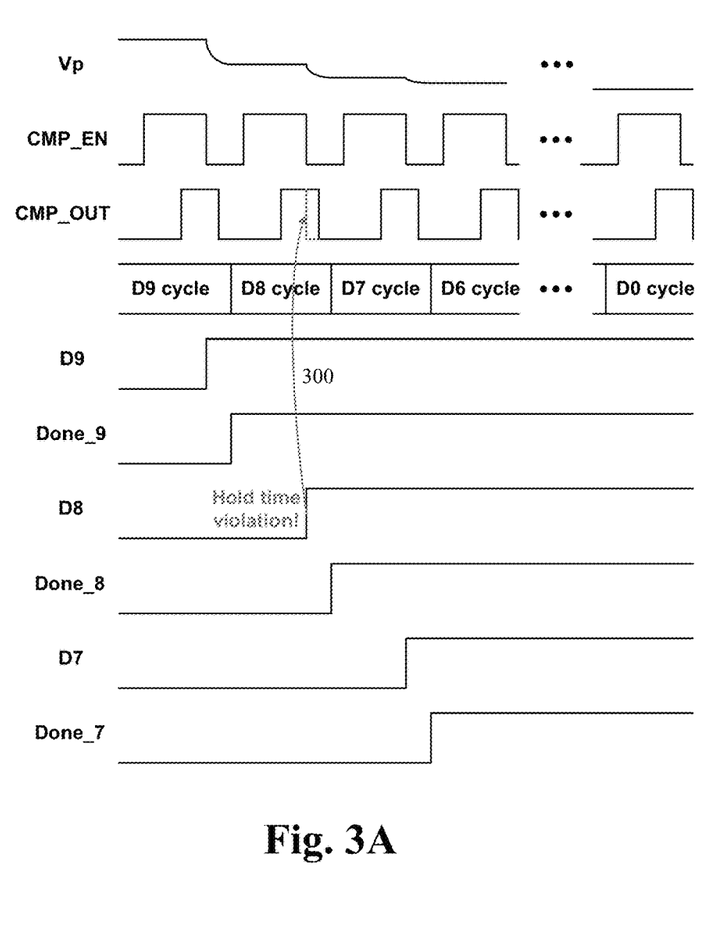
FIGS. 3A and 3B represent two example timing violations for the example ADC.
Figure 3B:
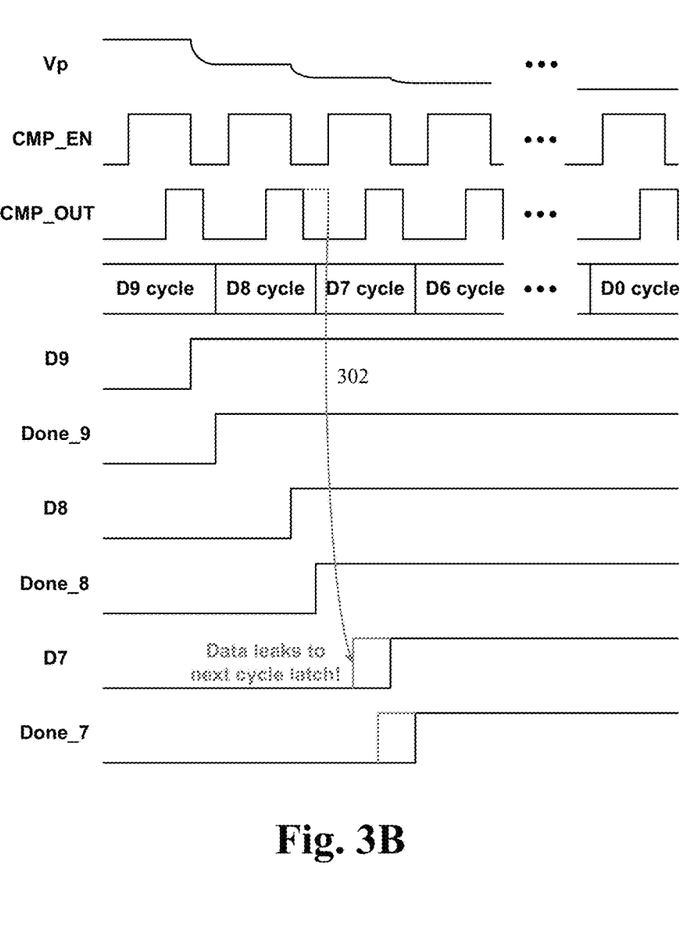

If the CMP_OUT pulse is narrow, then there is hold time violation 300 for latch 118 such as shown in FIG. 3A. If the CMP_OUT pulse is wide, it may trigger the next cycle latch 118 which leads to a data leaks to next cycle latch problem 302 such as shown in FIG. 3B.

As a result when the SAR ADC 100 speed is pushed to its limit (T_cycle=T_cmp+T_latch+T_DAC), it is very difficult to design the CMP_OUT and DONE delay with reliable timing across PVT (fabrication process, supply voltage, operating temperature). Hence the SAR ADC 100 has to run at a slower rate than defined by T_cycle_min. Thus the SAR ADC 100 speed is limited by the timing requirement of comparator 106, latches 118 and the CDAC 108 signal loop.

Now discussed is a multi-phase analog to digital converter (ADC) that addresses the timing concerns just discussed.

Figure 4:
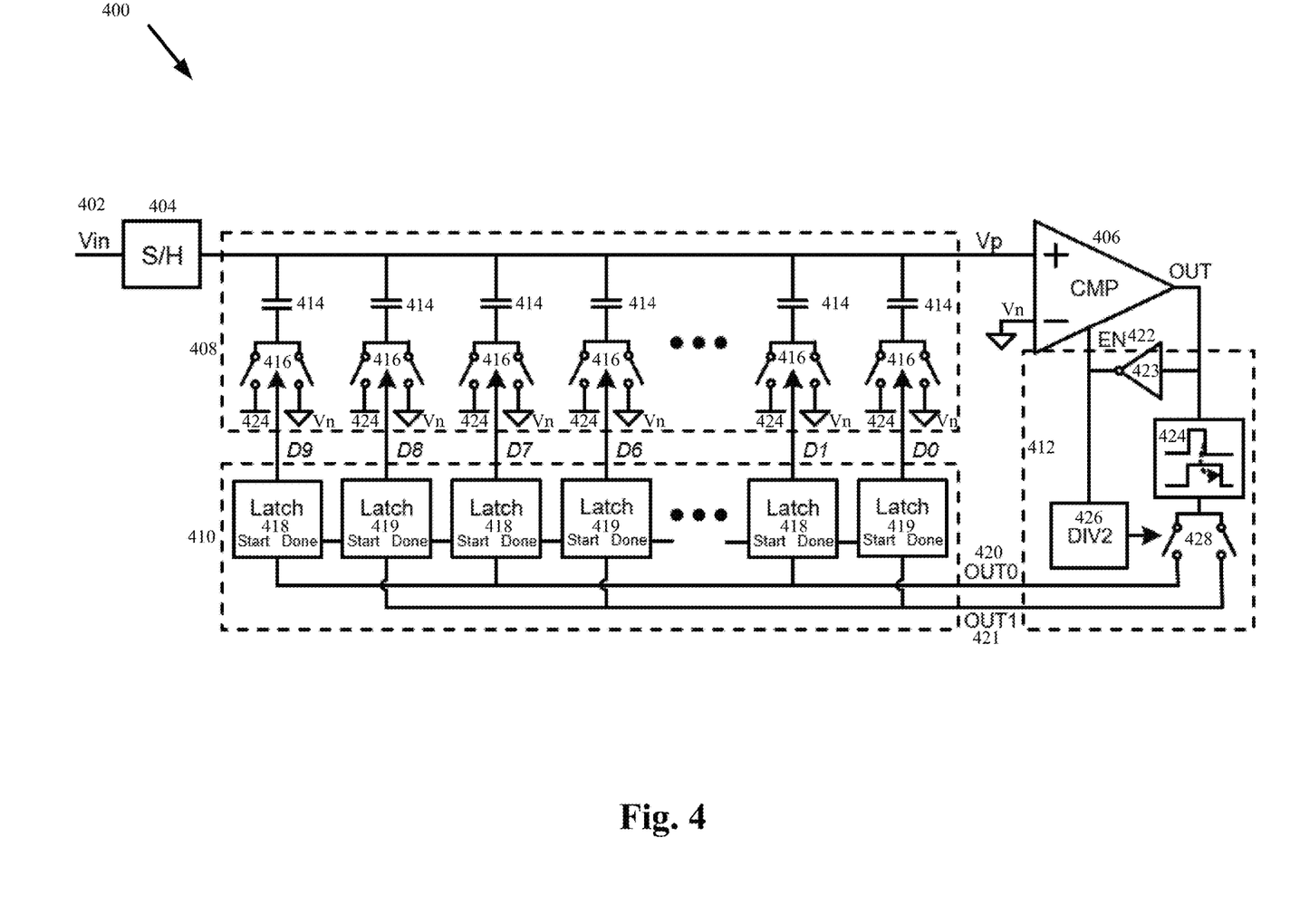
FIG. 4 represents an example multi-phase analog to digital converter (ADC).

FIG. 4 represents an example 400 multi-phase analog to digital converter (ADC). The ADC 400 also has a successive-approximation register (SAR) topology (single-ended circuit shown, however a differential mode circuit can also be derived from this), configured for asynchronous operation. The SAR ADC 400 converts an analog input voltage (Vin) 402 into digital output signal (D9-D0) using a binary search through all possible quantization levels before finally converging upon the digital output signal (D9-D0) for each conversion.

The SAR ADC 400 includes: a sample-and-hold (S/H) circuit 404 configured to receive the input voltage (Vin) 402, and an analog voltage comparator 406 that compares Vin 402 to an accumulated set of capacitor voltages (Vn) output from an internal DAC 408 (e.g. CDAC) that have been selected by a controller 410. The comparator 406 output (CMP_OUT) is fed into a feedback circuit 412 that is also coupled to the controller 410.

The internal DAC 408 includes a set of DAC elements. Wherein the DAC elements include capacitors 414 and a set of switches 416. The controller 410 includes a first set of latches 418 (i.e. a first set of controller elements) and a second set of latches 419 (i.e. a first set of controller elements) that trigger each other (i.e. done> start) after each successive comparison.

The feedback circuit 412 is configured to generate a first feedback signal 420 (e.g. CMP_OUT0 phase) and a second feedback signal 421 (e.g. CMP_OUT1 phase) sent back to the controller 410 and includes an inverter 423 for generating an enable signal 422 (CMP_EN) sent back to the comparator 406. The feedback circuit 412 further includes a delay circuit 424, a divider 426 (DIV2), and a phase select switch 428, the operation of which is further discussed below.

A clock circuit (not shown) drives various circuits in the SAR ADC 400 as well and a Vref voltage 424 is also included. The SAR ADC 400 controller 410 can also be programmed to operate either synchronously or asynchronously.

While operation of the multi-phase SAR ADC 400 has similarities to the FIG. 1 SAR ADC 100, additional differences are now discussed further below.

The multi-phase SAR ADC 400 separates its controller 410 latches 418, 419, and corresponding internal DAC 408 capacitances 414 and switches 416, into at least two CDAC groups. The feedback circuit 412 is designed to generate the first feedback signal 420 (e.g. CMP_OUT0 phase) for driving/enabling the first set of latches 418 in the controller 410, and the second feedback signal 421 (e.g. CMP_OUT1 phase) for driving/enabling the second set of latches 419 in the controller 410, from the comparator 406 output signal (CMP_OUT).

Using this two phase circuit, the multi-phase SAR ADC 400 operates as a ping-pong dynamic comparator structure driving alternative CDAC groups in the asynchronous SAR ADC. The CDAC groups operate in interleaved phases, such that when one group is in a hold phase, and the other group is in a sample phase. In other words, the first and second controller latches 418, 419 are configured to operate in interleaved phases, such that when the first set of controller latches 418 are in a hold phase, then the second set of controller latches 419 are in a sampling phase. For example, the hold phase holds current digital outputs of the first set of controller latches 418, while the sampling phase permits changes in current digital outputs the second set of controller latches 419.

As a result a current CMP_OUT for a current conversion cycle, won't be passed to a next conversion cycle regardless of any delay in a conversion DONE signal. Thus without the concern of timing, SAR ADC speed can be safely pushed to its process limits without timing issues between the comparator 406 and the controller's 410 data latches 418, 419.

In the feedback circuit 412 the comparator output pulse (CMP_OUT) is extended by delaying the falling edge using the delay circuit 424. The extended CMP_OUT is switched between two phases (e.g. even/odd) OUT0 and OUT1 using the phase select switch 428 which is driven by the divider 426 (DIV2). The divider 426 (DIV2) itself is driven by the enable signal 422 (CMP_EN).

When one group of latches 418 (i.e. CDAC group) is driven by the comparator 406, the other group of latches 419 (i.e. CDAC group) is always in a hold phase. Thus the two CDAC groups 418, 419 see the comparator 406 output alternatively and the maximum data rate of the latches 418, 419 are reduced by half. Thus the pulse width of CMP_OUT from the comparator 406 can be extended to ensure/secure the latches 418, 419 hold time. Using this circuit, the timing requirement of the controller's 410 logic latches 418, 419 is significantly relaxed, and the multi-phase SAR ADC 400 speed can be pushed to the limit without timing issues.

The cycle time (T_cycle) for each bit (D9-D0) of the SAR ADC 400 conversion is still T_cycle=T_cmp+T_latch (for either group 418, 419)+T_DAC. T_cmp is a comparator decision time (e.g. comparator enable>>Vout), T_latch is a controller 410 latch delay, and T_DAC is the internal DAC 408 settling time.

Note while only two phases are discussed here, in other example embodiments the feedback circuit 412 can be configured to generate additional phase feedback signals that divide the controller 410 latches and internal DAC 408 capacitances 414 and switches 416 into additional groups/phases.

Figure 5:
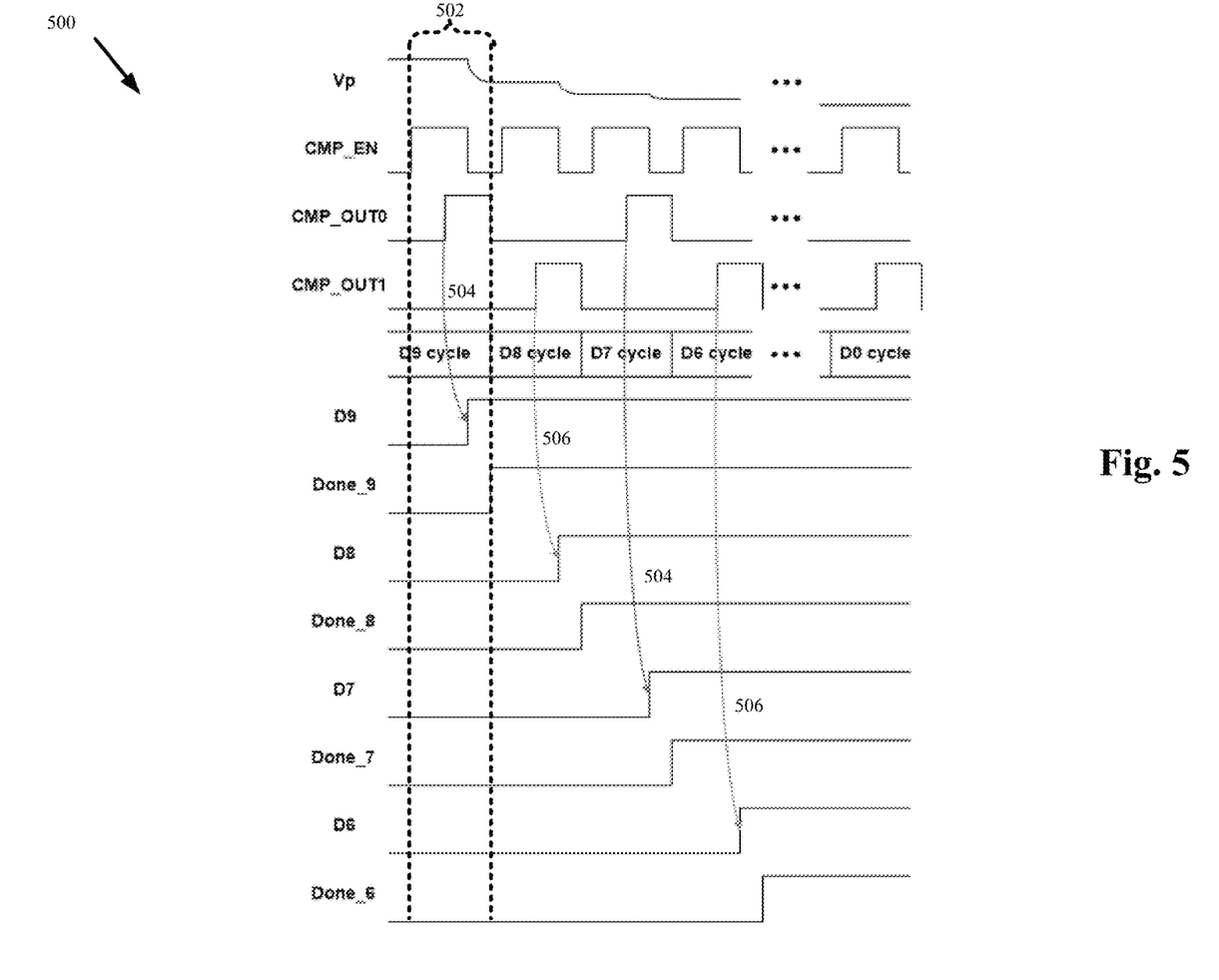
FIG. 5 represents an example set of idealized operational signals for the multi-phase ADC.

FIG. 5 represents an example 500 set of idealized operational signals for the multi-phase ADC 400. T_cycle 502, T_latch 504 (first CDAC group 418), and T_latch 506 (second CDAC group 419) are as shown.

Figure 6A:
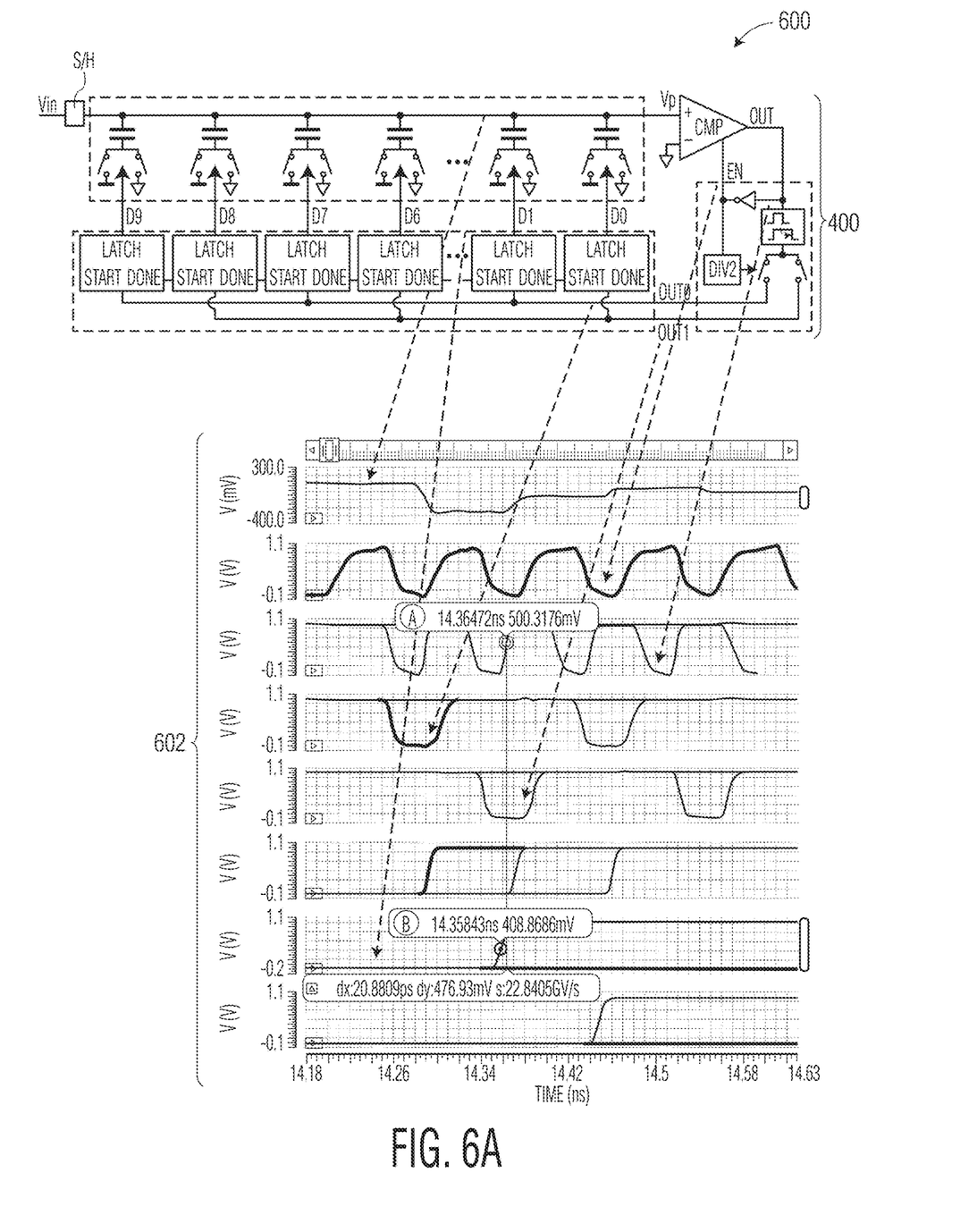
FIG. 6A: example mapping between the multi-phase ADC and a set of simulated signals 602.

FIG. 6A: example 600 mapping between the multi-phase ADC 400 and a set of simulated signals 602.

Figure 6B:
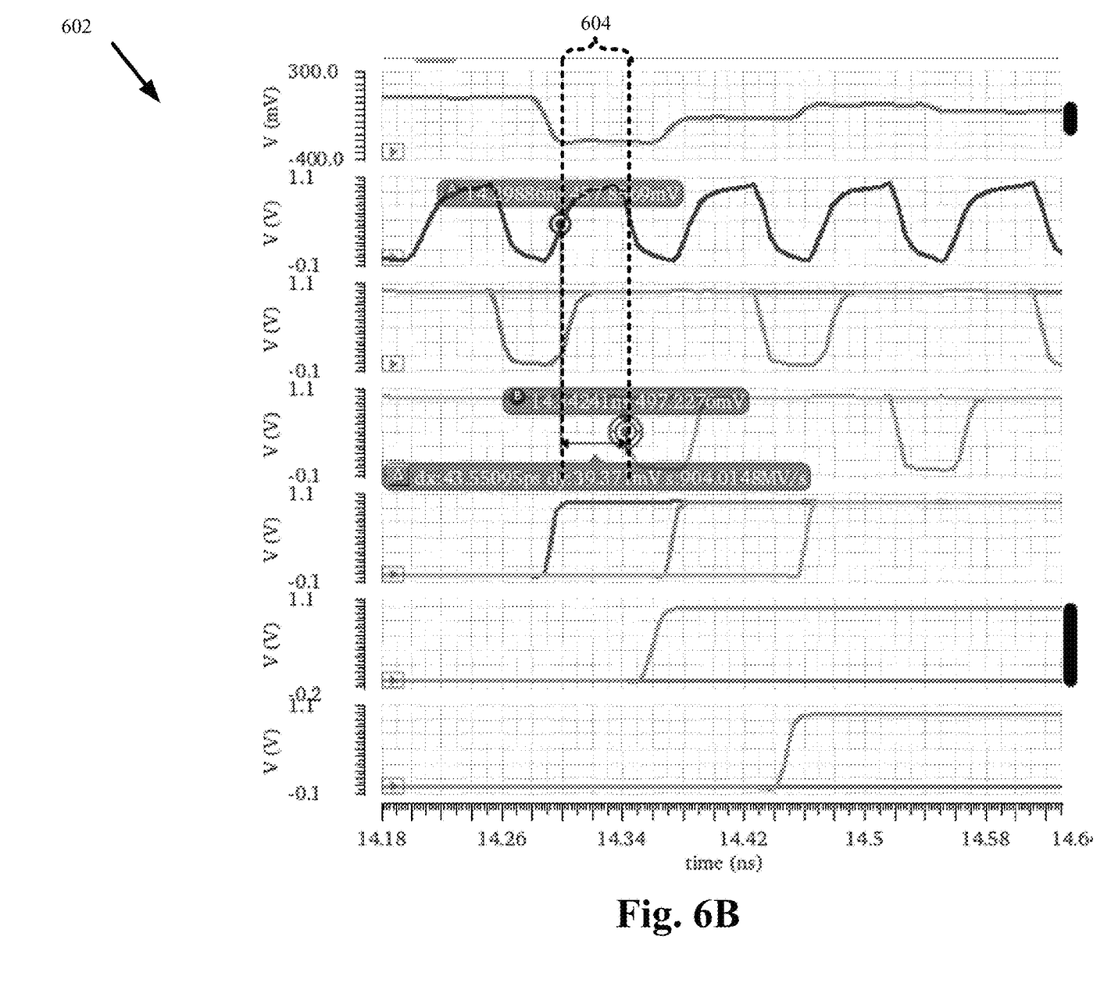
FIG. 6B: example T_cmp time in the multi-phase ADC.

FIG. 6B: example T_cmp time 604 in the multi-phase ADC 400. The T_cmp time 604 is the delay from comparator EN to OUT.

Figure 6C:
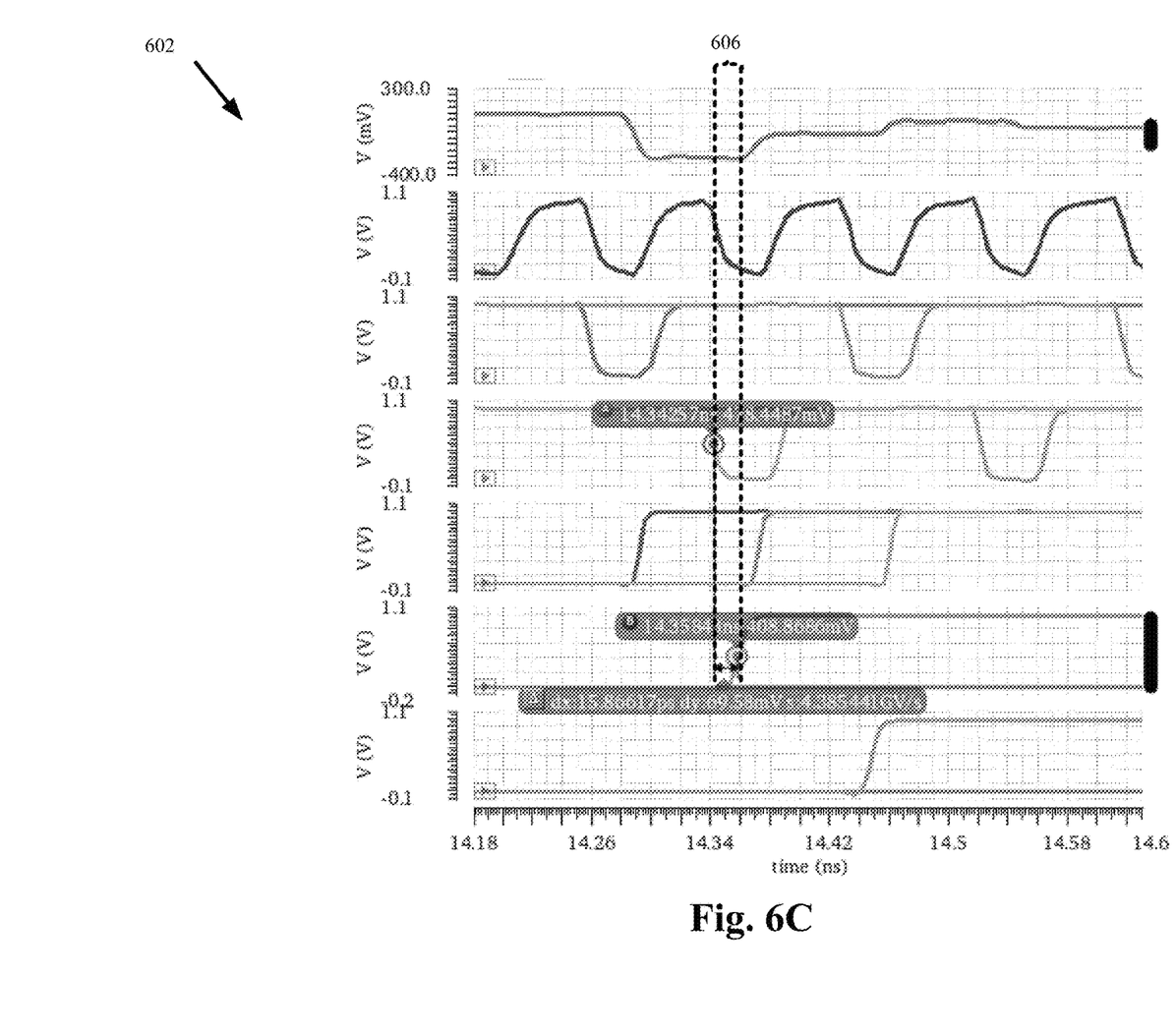
FIG. 6C: example T_latch time in the multi-phase ADC.

FIG. 6C: example T_latch time 606 in the multi-phase ADC 400. The T_latch time 606 is the delay from comparator OUT to CDAC Input.

Figure 6D:
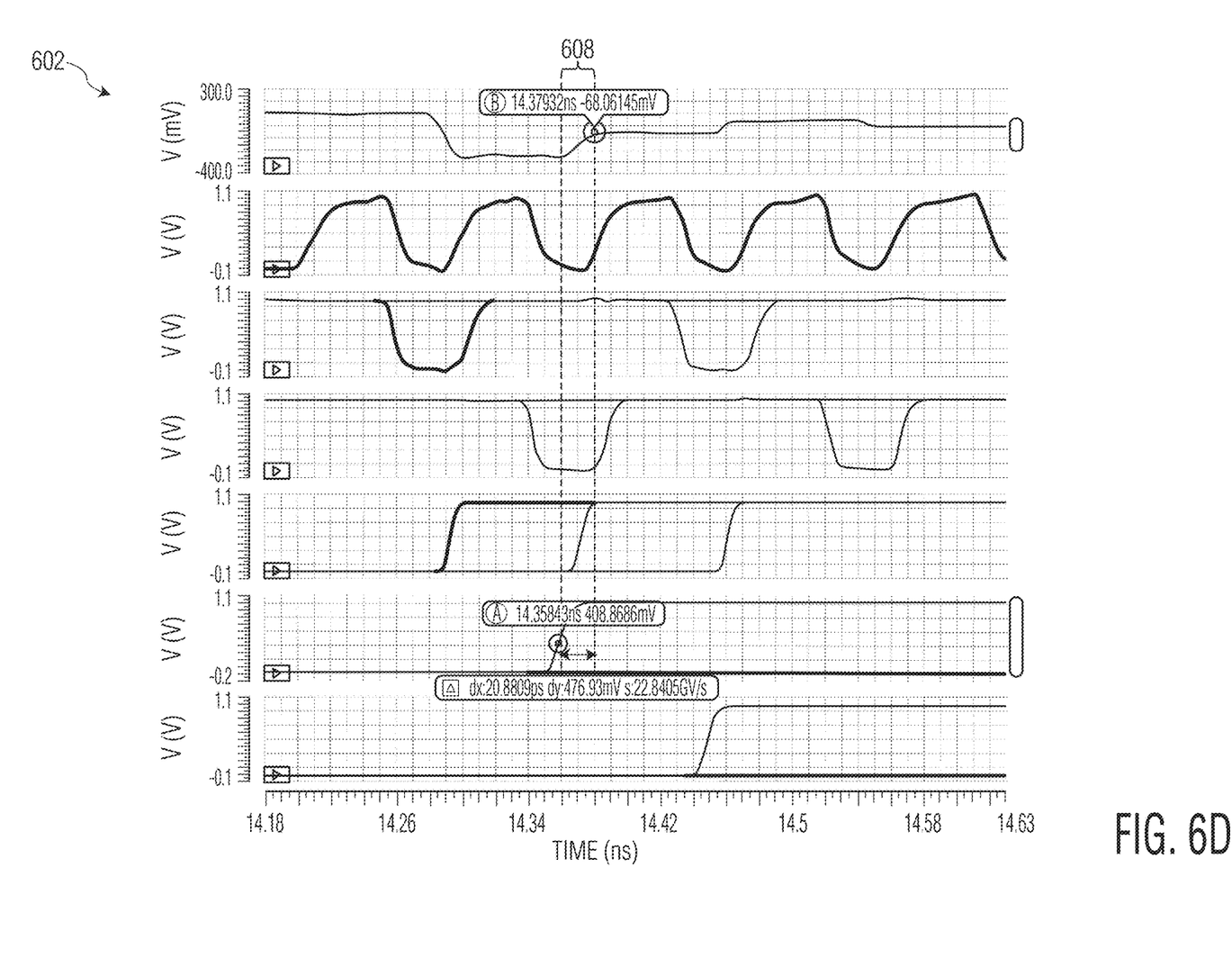
FIG. 6D: example T_DAC time in the multi-phase ADC.

FIG. 6D: example T_DAC time 608 in the multi-phase ADC 400. The T_DAC time 608 is the delay 614 from CDAC input to Vin.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. An analog to digital converter (ADC), comprising:
   an analog comparator configured to receive an analog input signal and in response generate a comparator output signal;
   a set of digital to analog converter (DAC) elements configured to receive the analog input signal;
   wherein the DAC elements are configured to generate an analog DAC output signal in response to a digital code and the analog input signal;
   wherein the comparator is configured to receive the analog DAC output signal;
   a feedback circuit configured to generate a first feedback signal and a second feedback signal from the comparator output signal;
   a controller configured to enable a first set of controller elements in response to the first feedback signal;
   wherein the controller is configured to enable a second set of controller elements in response to the second feedback signal; and
   wherein the first and second controller elements are configured to generate the digital code.

2. The ADC of claim 1:
   wherein the first feedback signal is generated at a different time than the second feedback signal.

3. The ADC of claim 1:
   wherein the first set of controller elements are not enabled at a same time as the second set of controller elements.

4. The ADC of claim 1:
   wherein the first and second controller elements are configured to operate in a hold phase and a sampling phase.

5. The ADC of claim 4:
   wherein when the first set of controller elements are in the hold phase, then the second set of controller elements are in the sampling phase.

6. The ADC of claim 5:
   wherein the hold phase holds a current digital output of at least one of the controller elements.

7. The ADC of claim 5:
   wherein the sampling phase enables a current digital output of at least one of the controller elements to change in response to the analog input signal.

8. The ADC of claim 1:
   wherein the feedback circuit includes a divider and a phase select switch configured to generate the first and second feedback signals from the comparator output signal.

9. The ADC of claim 8:
   wherein the phase select switch is configured to receive the comparator output signal from a delay circuit.

10. The ADC of claim 9:
    wherein the delay circuit is configured to delay a falling edge of the comparator output signal.

11. The ADC of claim 8:
    wherein the feedback circuit further includes an inverter configured to enable the comparator in response to the comparator output signal.

12. The ADC of claim 1:
    wherein the first and second controller elements are latches.

13. The ADC of claim 12:
    wherein a subset of the latches are configured to be activated by receiving a signal from another latch.

14. The ADC of claim 12:
    wherein the latches are successively activated in series.

15. The ADC of claim 1:
    wherein the analog input signal is an analog input voltage.

16. The ADC of claim 1:
    wherein at least one of the DAC elements includes a capacitor and a switch.

17. The ADC of claim 16:
    wherein one end of the capacitor is coupled to the analog input signal;
    wherein another end of the capacitor is coupled to the switch;
    wherein the switch is further coupled to the comparator; and
    wherein a position of the switch is controlled by at least one bit in the digital code.

18. The ADC of claim 16:
    wherein the capacitor and the switch together form a capacitor DAC (CDAC) element.

19. The ADC of claim 1:
    wherein the ADC is configured as a successive-approximation register (SAR) ADC.

* * * * *